(12) United States Patent
Chakravarthi et al.

(10) Patent No.: US 7,902,576 B2
(45) Date of Patent: Mar. 8, 2011

(54) PHOSPHORUS ACTIVATED NMOS USING SIC PROCESS

(75) Inventors: Srinivasan Chakravarthi, Murphy, TX (US); P.R. Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 11/558,161

(22) Filed: Nov. 9, 2006

(65) Prior Publication Data

US 2007/0072383 A1 Mar. 29, 2007

Related U.S. Application Data

(62) Division of application No. 10/943,278, filed on Sep. 17, 2004, now Pat. No. 7,179,696.

(51) Int. Cl.
*H01L 29/76* (2006.01)

(52) U.S. Cl. ........... 257/288; 257/77; 257/344; 257/408; 257/E29.277

(58) Field of Classification Search ........... 257/E29.277, 257/77
See application file for complete search history.

(56) References Cited

U.S. PATENT DOCUMENTS

| | | | |
|---|---|---|---|
| 4,769,686 A | 9/1988 | Horiuchi et al. | |
| 5,387,807 A | 2/1995 | Bayraktaroglu | |
| 6,229,197 B1 | 5/2001 | Plumton et al. | |
| 6,576,535 B2 | 6/2003 | Drobny et al. | |
| 6,605,498 B1 | 8/2003 | Murthy et al. | |
| 6,621,131 B2 | 9/2003 | Murthy et al. | |
| 6,989,322 B2 | 1/2006 | Gluschenkov et al. | |
| 7,005,333 B2 * | 2/2006 | Li | 438/172 |
| 7,176,522 B2 * | 2/2007 | Cheng et al. | 257/338 |
| 7,227,205 B2 * | 6/2007 | Bryant et al. | 257/288 |
| 2002/0047125 A1 * | 4/2002 | Fukuda et al. | 257/77 |
| 2003/0098479 A1 | 5/2003 | Murthy et al. | |
| 2004/0262683 A1 | 12/2004 | Bohr et al. | |
| 2004/0262694 A1 | 12/2004 | Chidambaram | |
| 2005/0035409 A1 * | 2/2005 | Ko et al. | 257/350 |
| 2005/0079692 A1 | 4/2005 | Samoilov et al. | |
| 2005/0227446 A1 * | 10/2005 | Kao et al. | 438/305 |
| 2005/0285212 A1 * | 12/2005 | Tolchinsky et al. | 257/408 |
| 2005/0287752 A1 | 12/2005 | Nouri et al. | |

OTHER PUBLICATIONS

S. Solmi and D. Nobili, "High concentration diffusivity and clustering of arsenic and phosphorus in silicon," Journal of Applied Physics, Mar. 1, 1998, vol. 83, No. 5, pp. 2484-2490.

* cited by examiner

*Primary Examiner* — Kenneth A Parker
*Assistant Examiner* — Jose R Diaz
(74) *Attorney, Agent, or Firm* — Jacqueline J. Garner; Wade J. Brady, III; Frederick J. Telecky, Jr.

(57) ABSTRACT

A method (10) of forming a transistor (100) includes treating (12) at least some of a semiconductor substrate (102) with carbon and then forming (18) a gate structure (114) over the semiconductor substrate. A channel region (122) is thereby being defined within the semiconductor substrate (102) below the gate structure (114). Source and drain regions (140, 142) are then formed (26) within the semiconductor substrate (102) on opposing sides of the channel (122) with a phosphorus dopant.

2 Claims, 14 Drawing Sheets

PHOSPHORUS ACTIVATED NMOS USING SIC PROCESS

This is a divisional application of Ser. No. 10/943,278, filed Sep. 17, 2004, now U.S. Pat. No. 7,179,696.

FIELD OF INVENTION

The present invention relates generally to semiconductor fabrication and more particularly to utilizing a phosphorus dopant in a semiconductor substrate that has been treated to include silicon carbon material in a transistor fabrication process.

BACKGROUND OF THE INVENTION

A conventional MOS transistor generally includes a semiconductor substrate, such as silicon, having a gate structure or gate stack formed thereover. The gate structure comprises a conductive gate electrode overlying a thin gate dielectric. The gate electrode typically includes polysilicon and the gate dielectric an oxide based material. Source and drain regions are formed in the substrate substantially aligned with the gate structure. The source and drain regions are generally formed by applying a dopant to the select regions of the substrate. A channel is defined within the substrate under the gate structure between the source and drain regions.

A voltage applied to the gate electrode induces an electric field across the channel of the MOS transistor, and the amount of current that flows through the channel is directly proportional to an activation level of the source and drain regions. Thus, the higher the activation level of the source and drain regions, the more current can flow and the faster a circuit can perform wherein such a MOS transistor is incorporated. Phosphorous is a dopant that causes source and drain regions to have a high activation level as compared to conventional source/drain dopants, such as arsenic, for example. However, phosphorus has a high diffusity which can lead to non-abrupt junctions. Non-abrupt junctions can be detrimental to the performance of the transistor by adversely affecting channel characteristics, injection velocity, carrier mobility and/or drive current.

It would thus be advantageous to have a phosphorus doped transistor wherein diffusity is substantially mitigated.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to a device and method of fabrication, wherein a transistor device exhibits a high level of activity due to the use of phosphorus as a source/drain dopant. One or more portions of a silicon substrate upon which the device is formed are treated to include carbon which mitigates the proclivity of phosphorus to diffuse. In this manner, a transistor device having a high level of activity is produced having more abrupt junctions. As such, channel characteristics, injection velocity, carrier mobility and/or drive current are thereby enhanced. Further, the carbon within the substrate may produce a tensile stress therein which may further enhance mobility and lower channel resistance.

To the accomplishment of the foregoing and related ends, the following description and annexed drawings set forth and detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
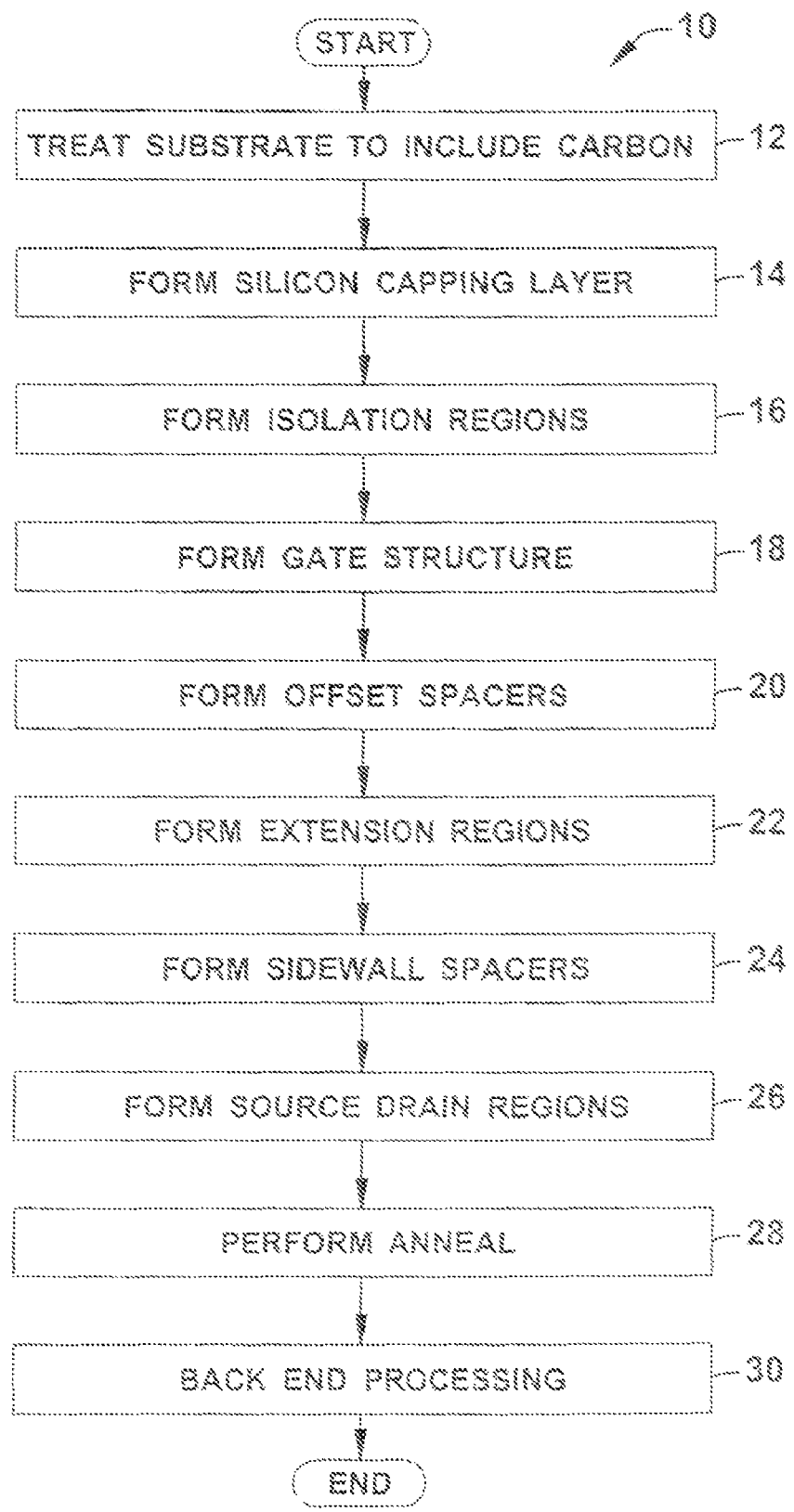
FIG. 1 is a flow chart illustrating an exemplary methodology of forming a transistor according to one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced in the Figs., subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

The present invention relates to forming a transistor in a manner that mitigates phosphorus diffusion. In particular, a phosphorus dopant is utilized in forming source and drain regions of the transistor. To mitigate phosphorus diffusion, a substrate into which the phosphorus is implanted and in which the source and drain regions are formed is treated to include carbon prior to the source/drain implantation. The carbon acts as a gettering agent for phosphorus interstitials that have a tendency to diffuse. In this manner, the highly active phosphorus can be desirably implanted while the carbon facilitates maintaining substantially abrupt source/drain junctions. Further, the carbon may produce a tensile stress within the substrate that may further enhance carrier mobility and lower channel resistance.

Turning to FIGS. 1-10, an exemplary methodology 10 is illustrated for forming a transistor 100 (FIG. 10) according to one or more aspects of the present invention, wherein FIG. 1 illustrates the exemplary methodology 10 and FIGS. 2-10 illustrate the exemplary transistor device at various stages of fabrication. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
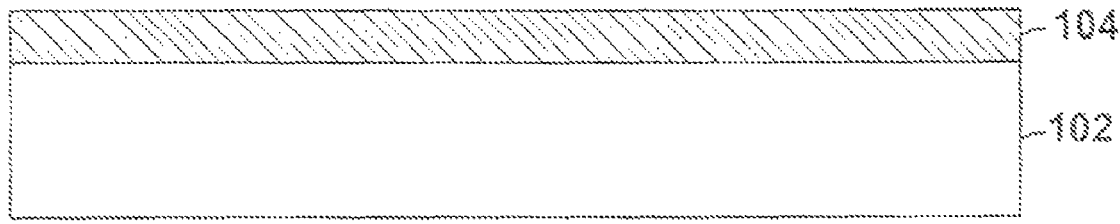
FIGS. 2-10 are a plurality of fragmentary cross sectional diagrams illustrating a transistor device being formed in accordance with the methodology set forth in FIG. 1.

The methodology 10 begins at 12 wherein a semiconductor substrate 102 is treated to include carbon to produce a layer of silicon carbon material 104 over or at a top portion of the substrate. (FIG. 2). It is to be appreciated that substrate or semiconductor substrate as used herein can include a base semiconductor wafer or any portion thereof (e.g., one or more wafer die) as well as any epitaxial layers or other type of semiconductor layers formed thereover and/or associated therewith. The substrate can comprise, for example, silicon, silicon germanium, etc. The silicon carbon layer 104 may be formed to a thickness of between about 400 angstroms to about 600 angstroms via an epitaxial process performed over an entire wafer, for example. Epitaxy is a process by which a thin layer of single-crystal material is deposited on a single-crystal substrate. Epitaxial growth occurs in such way that the crystallographic structure of the substrate is reproduced in the growing material.

To establish the silicon carbon layer 104, a carbon containing source gas such as HCl and/or disilane can be added to an epitaxial deposition chamber, for example, such that carbon is incorporated into the silicon in-situ. It will be appreciated that doing a silicon carbide epi deposition is different from masking off an area and doing a carbon implant because different equipment is used and the amount of carbon obtainable is much higher. For example, the amount of carbon produced within/upon the substrate in accordance with one or more aspects of the present invention, may be on the order of about 0.5 to about 2 atomic percent for a layer having a thickness of between about 100 to about 300 angstroms. Such a concentration of carbon may provide a tensile strain in the substrate, and more particularly within a channel region established within the substrate (discussed below), of about 300 megapascals to about 2 gigapascals, for example, where such a tensile strain can improve electron mobility within the channel and thus the operating speed of a resulting NMOS transistor.

Figure 3:
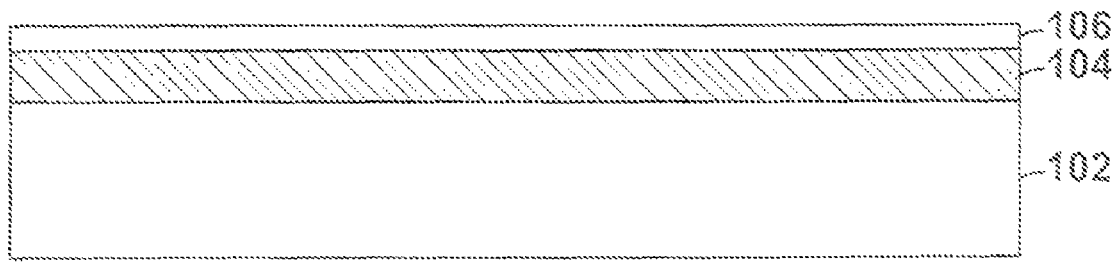

The methodology 10 then advances to 14, wherein a layer of silicon capping material 106 is formed over the carbon including semiconductor substrate (FIG. 3). For example, a subsequent silicon deposition may be performed within the same processing chamber with the carbon source (e.g., HCl feed gas) turned off. The layer of silicon capping material 106 may be formed to a thickness of between about 100 angstroms to about 400 angstroms, for example, depending upon the device being formed and how it is to be optimized. In this manner, the silicon carbide layer 104 is operative to provide stress to the channel region established within the substrate (discussed below), while not giving rise to contamination issues within the channel.

Figure 4:
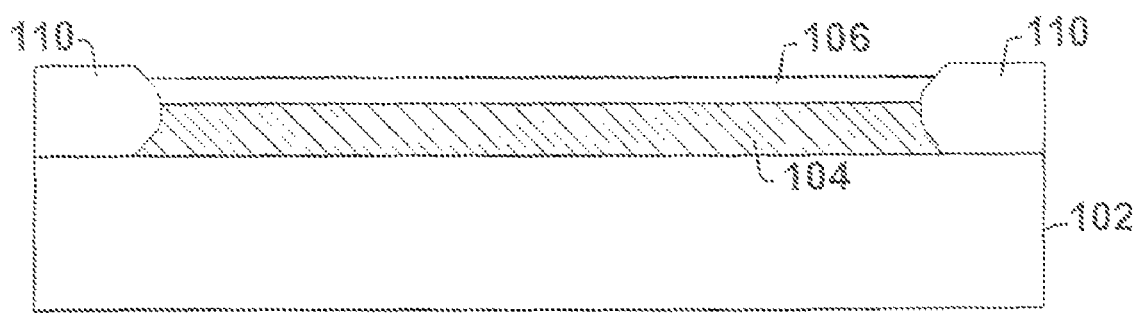

An isolation process (e.g., STI, LOCOS) is then performed at 16 to establish areas of dielectric material 110 within the substrate 102 (FIG. 4). The isolation regions 110 electrically isolate active regions from one another (e.g., the region where the transistor is formed). The isolation process is, however, generally performed at a relatively high temperature (e.g., on the order of about 1000 degrees Celsius for about 30 minutes), which can deactivate the carbon. Thus, amorphizing dopants (not shown) may be implanted to reactivate the carbon. By way of example, Germanium can be implanted at about 1E14 atoms/cm$^3$ and/or Indium can be implanted at about 1 E13 atoms/cm$^3$. Such amorphizing implants can be implanted along with VtADJUST implants (not shown) that are utilized to adjust a threshold voltage at which the transistor begins to conduct current or "turns on".

Figure 5:
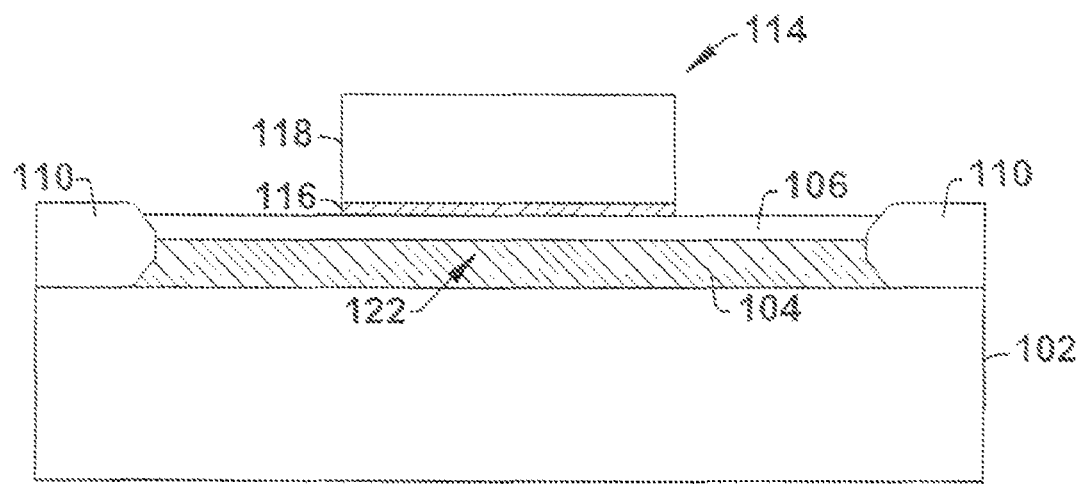

Subsequently, at 18, a gate structure or gate stack 114 is formed over the layer of capping material 106 and silicon carbon layer 104 (FIG. 5). Although not shown, it will be appreciated that the gate structure 114 is created by forming a layer of gate dielectric material over the layer of capping material 106, and then forming a layer of gate electrode material over the layer of gate dielectric material. The layer of gate dielectric material can include any of a number of suitable dielectric or non-conductive materials. Some examples include silicon dioxide, high-k dielectric materials, or a stack of such layers. By way of further example, the layer of gate dielectric material may include any one or more of the following, either alone or in combination: $SiO_2$, aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

Additionally, the layer of gate dielectric material can be formed to a thickness of about 1 nanometer or more, and can have an equivalent oxide thickness (EOT) of about 1 nanometer or less, for example, while the gate electrode layer can be formed to a thickness of between about 50 to about 200 nanometers, for example. The gate electrode layer generally includes polysilicon, SiGe and/or metal. The gate electrode and gate dielectric layers are then patterned to establish the gate stack 114. Generally, the layer of gate electrode material is patterned first and the layer of gate dielectric material becomes at least partially patterned as part of this process. For example, an etchant utilized to pattern the layer of gate electrode material may also remove some of the layer of gate dielectric material. Similarly, clean up steps associated with patterning the layer of gate electrode material as well as clean up steps associated with a hard mask removal process may also remove some of the layer of gate dielectric material. The gate structure or stack 114 is thereby established which comprises a gate dielectric 116 under a gate electrode 118. The gate electrode 118 is somewhat electrically conductive, and may be made more conductive via doping. The gate electrode 118 provides a contact area or surface for applying a voltage to the transistor. Additionally, a channel region 122 is defined within the substrate under the gate stack 114.

Figure 6:
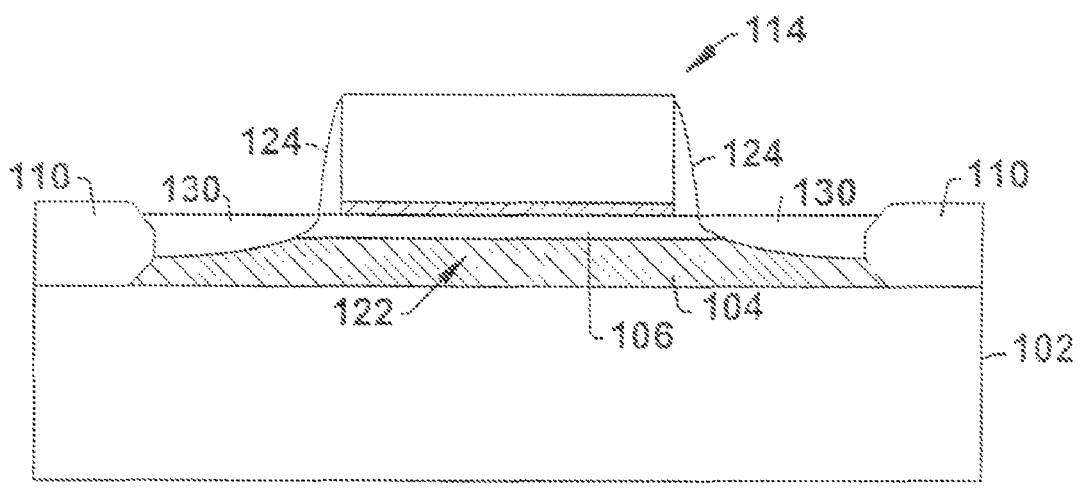

Offset spacers 124 are then formed adjacent to the gate structure 114 at 20 (FIG. 6). For example, a thin layer of offset material (e.g., oxide and/or nitride) is formed generally conformally over the patterned gate structure 114 and then etched using a generally directional etch, such as an anisotropic dry etch, for example, to remove the layer of offset material at all places other than adjacent to the gate structure 114. As such, thin offset spacers 124 are left on lateral edges of the gate stack 114. Such spacers 124 may have a width of between about 10 angstroms to about 50 nanometers, for example.

Figure 7:
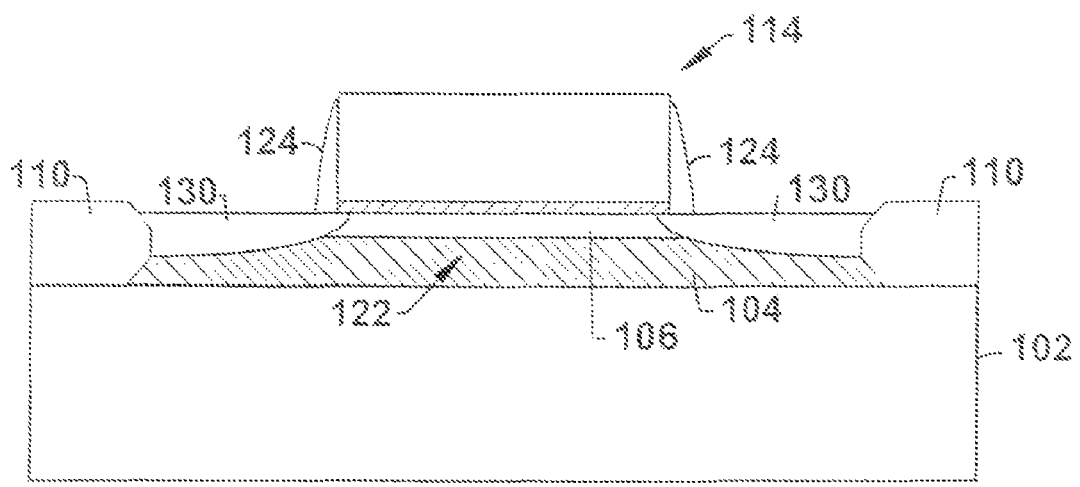

A source/drain extension region implant, for example, is then performed at 22 to establish extension regions 130 on opposing sides of the channel region 122 (FIG. 6). According to one or more aspects of the present invention a phosphorus dopant is utilized in forming the extension regions. It will be appreciated that lightly doped, medium doped or heavily doped extension region implants may be performed wherein the offset spacers 124 block the dopant materials so that the extension regions 130 are substantially self aligned with the offset spacers 124. A thermal process, such as a rapid thermal anneal, for example, may then be employed to activate the extension region dopants, which may cause the extension regions 130 to diffuse laterally underneath the offset spacers 124 and even slightly under the gate structure 114 toward the channel 122 (FIG. 7). It will be appreciated that the extension region may be between about 150 angstroms to about 400 angstroms thick after diffusion, for example.

Figure 8:
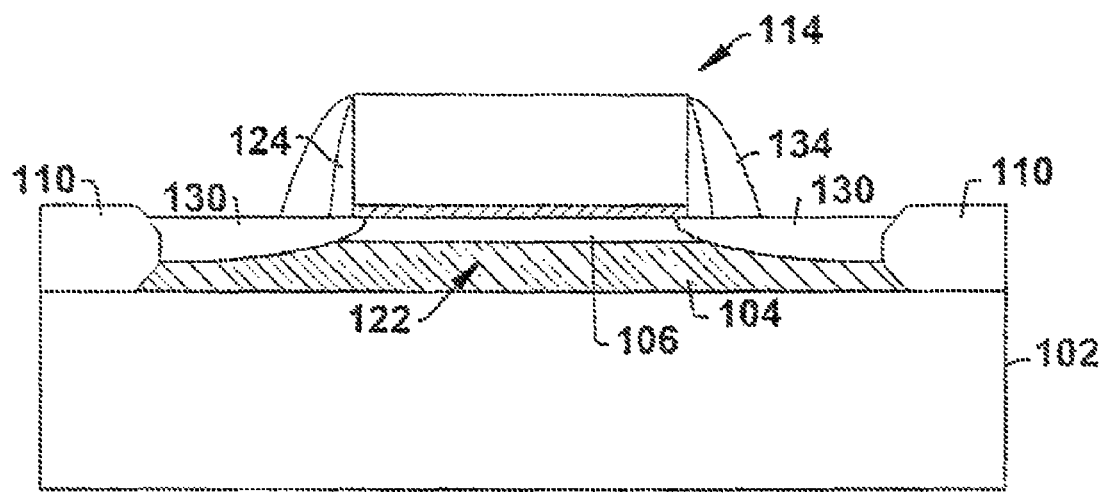

Sidewall spacers 134 are then formed on the offset spacers 124 at 24 (FIG. 8). The sidewall spacers comprise an insulating material such as an oxide, a nitride or a combination of such layers. The spacers 134 are formed by depositing a layer of such spacer material(s) in a generally conformal manner, followed by a directional (e.g., anisotropic) etch thereof, thereby removing such spacer material at all locations except adjacent to the offset spacers 124. The sidewall spacers 134 are substantially thicker than the offset spacers 124, and may have a thickness of between about 40 nanometers to about 140 nanometers, for example.

Figure 9:
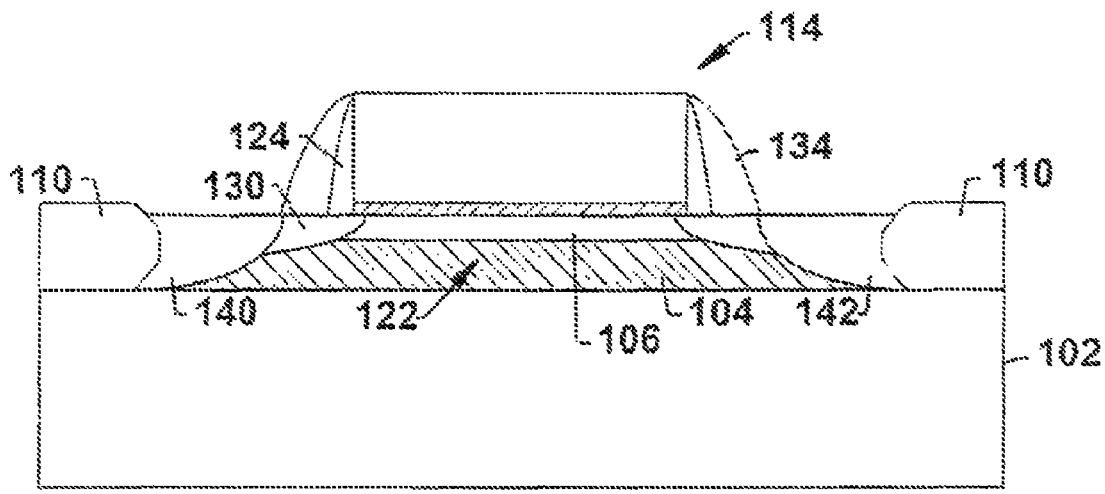

Source and drain regions 140, 142 are then formed by implanting a phosphorus dopant within the substrate at 26 (FIG. 9). The source/drain dopants are blocked by the sidewall spacers 134 so that the source and drain regions 140, 142 are substantially aligned with the sidewall spacers 134. Generally the source/drain dopants are implanted at a higher energy and/or concentration than the extension region implants so that the source and drain regions 140, 142 are formed to a greater depth and/or concentration than the extension regions 130. The source and drain regions 140, 142 may be formed to a depth of between about 500 angstroms to about 1500 angstroms, for example.

Figure 10:
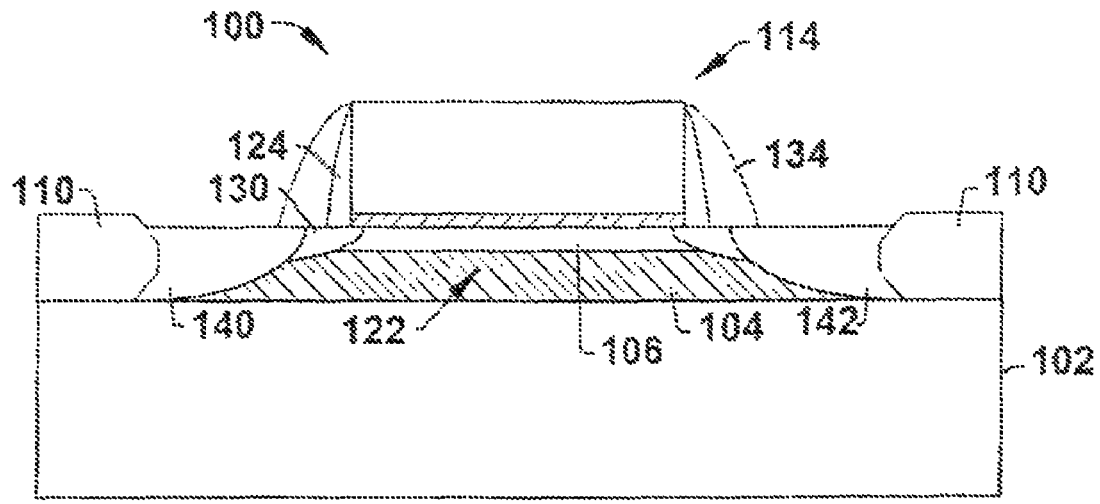

A thermal (annealing) process is then employed at 28 to activate the source/drain dopants, which may cause some lateral diffusion thereof (e.g., under the sidewall spacers 134, and toward the channel 122) (FIG. 10). The methodology 10 then advances to 30 wherein further back end processing can be performed, such as siliciding, for example. It will be appreciated that one or more aspects of the present invention are advantageous because while phosphorus is desirable as a dopant due to its high activity, its propensity to diffuse can lead to non-abrupt junctions (e.g., between the source and drain regions 140, 142 and the channel region 122), which can adversely affect transistor performance. Thus, treating the substrate to include carbon as disclosed herein allows the desirable properties of phosphorus to be taken advantage of while maintaining substantially abrupt junctions.

By way of further discussion, phosphorus is thought to diffuse primarily by an interstitial mechanism. More particularly, while not intending to be limited to any one theory, it is believed that phosphorus has a higher diffusity as compared to more conventional dopants because it is generally smaller in size. For example, a phosphorus atom is generally smaller than an arsenic atom. As such, the larger arsenic atom is more prone to come to "rest" or reside within a vacancy in the silicon lattice structure, where such a vacancy may be created, for example, when the dopant atoms are implanted into the substrate thereby disturbing the lattice structure. Some of the dopant atoms that bombard the substrate result in interstitials or atoms that are un-attached (e.g., those that do not fill respective vacancies). Due to its (smaller) size, phosphorus atoms have a greater tendency to remain as interstitials. Carbon tends to reduce the diffusion of phosphorus because the carbon acts as a sink or gettering agent for interstitials and thereby captures at least some of the phosphorus interstitials. Thus, interstitial atoms gettered by carbon atoms have a lower diffusity due to their (larger) size, for example. Additionally, carbon interstitials readily react with other carbon atoms to form an immobile pair. This is because carbon interstitials diffuse faster than substitutional carbon. Accordingly, utilizing phosphorus in forming a transistor on a carbon containing substrate in accordance with one or more aspects of the present invention reduces the number of phosphorus interstitials thereby making the phosphorus diffuse less aggressively, which in turn facilitates the creation of more abrupt junctions.

Figure 11:
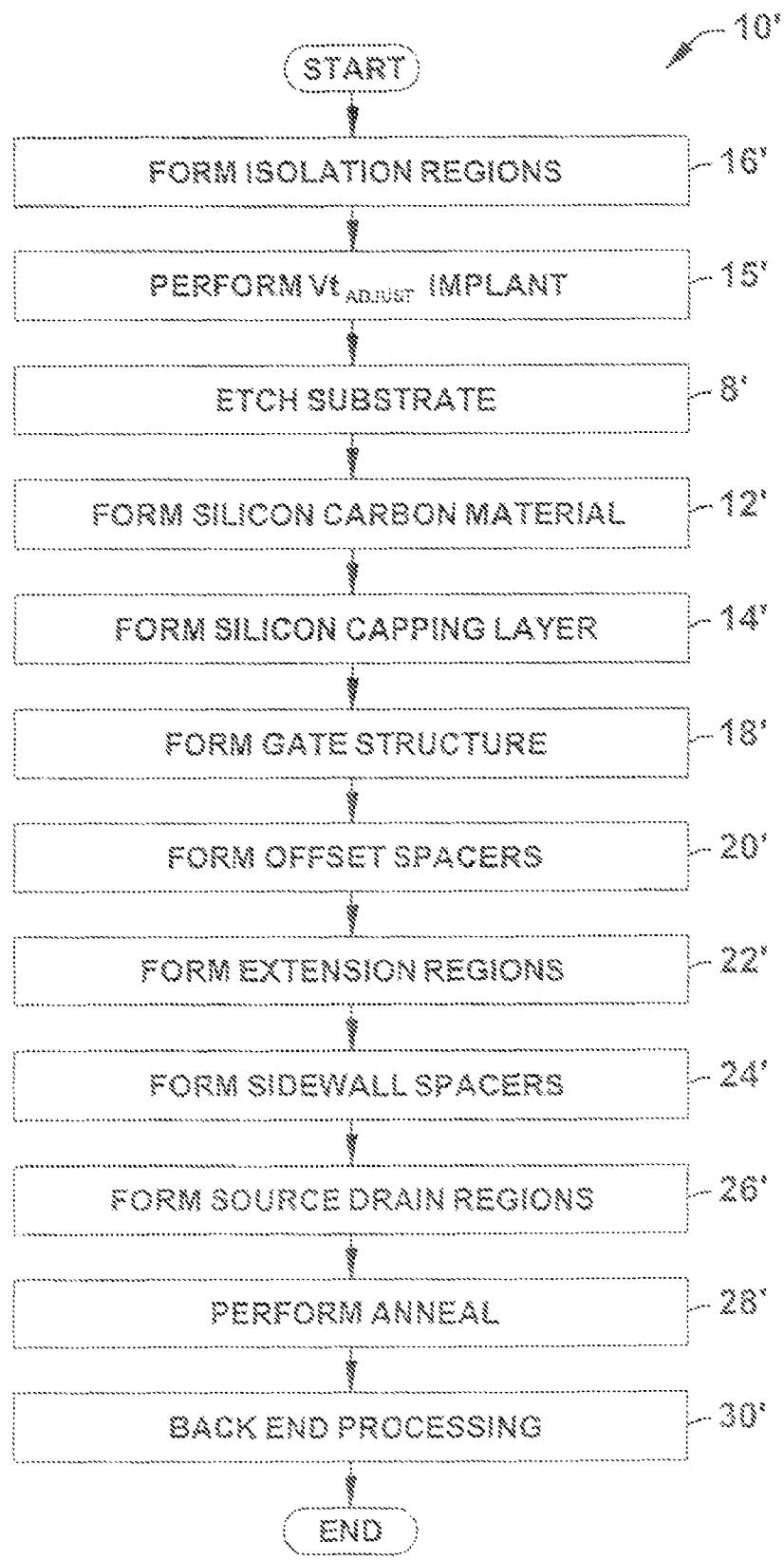
FIG. 11 is a flow chart illustrating another exemplary methodology of forming a transistor according to one or more aspects of the present invention.

Turning to FIGS. 11-20, another exemplary methodology 10' is illustrated for forming a MOS transistor 100' (FIG. 20) in accordance with one or more aspects of the present invention, wherein FIG. 11 illustrates the exemplary methodology 10' and FIGS. 12-20 illustrate the exemplary transistor device at various stages of fabrication. Many of the acts of methodology 10' are similar to those of methodology 10 and thus are addressed with the same reference characters, but having a prime "'" notation. Similarly, many of the layers, elements, etc. within the corresponding cross sectional FIGS. 12-20 are similar to those referred to within FIGS. 2-10 with regard to methodology 10 and thus are also labeled with the same reference characters, but also having a prime "'" designation. For purposes of brevity where the same layers, features, elements, acts, etc. of methodology 10 are reproduced in methodology 10' and the accompanying figures, they are not once again elaborated upon.

Figure 12:
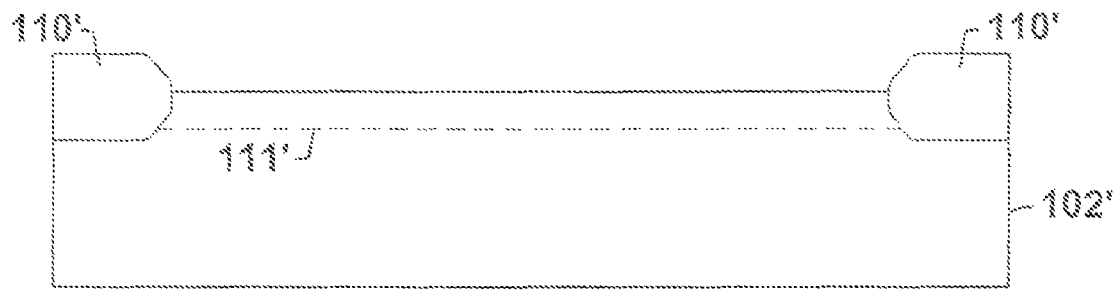
FIGS. 12-20 are a plurality of fragmentary cross sectional diagrams illustrating a transistor device being formed in accordance with the methodology set forth in FIG. 11.
Figure 13:
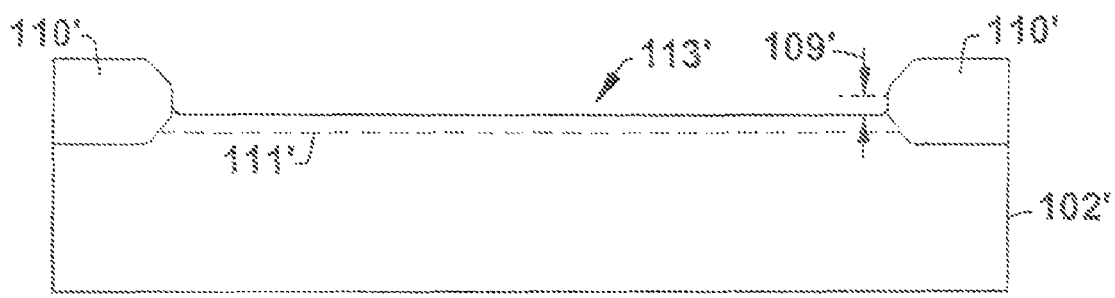
Figure 14:
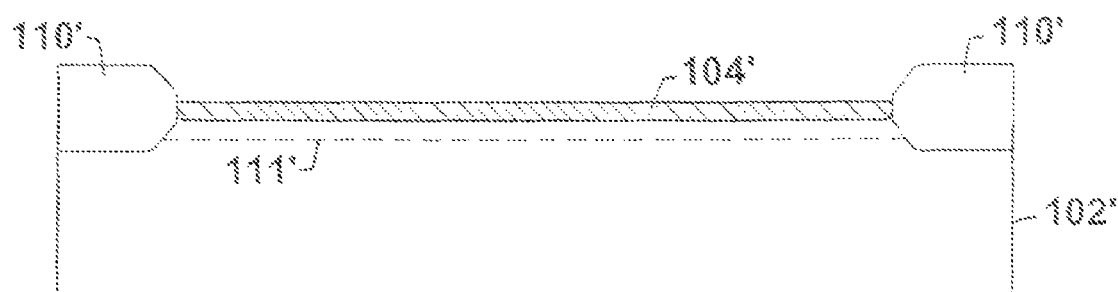

At 16' isolation regions 110' are formed within a substrate 102' to separate electrically active regions from one another (FIG. 12). For example, the substrate 102' can be selectively etched and dielectric materials can be formed within the etched areas to form the isolation regions 110'. A $Vt_{ADJUST}$ implant is then performed at 15' for setting or adjusting a threshold voltage of the transistor. As such, $Vt_{ADJUST}$ dopant atoms 111' are established within the substrate 102' (FIG. 12). The substrate 102' is then subjected to an optional etching process at 8' to form a recess 113' therein to a depth 109' of between about 200 angstroms to about 600 angstroms, for example (FIG. 13). The recess 113' is then filled with a silicon carbon material 104' at 12' (e.g., via an epitaxial process) (FIG. 14). It will be appreciated that the etching at 8' is optional because the layer of silicon carbon material 104' can be formed directly onto the substrate 102' as discussed above with regard to FIG. 2. Further, the $Vt_{ADJUST}$ implant is likewise optional and may also be performed before the isolation regions 110' are formed at 16' as well as after the silicon carbon material 104' is formed at 12'. Should dopant atoms be implanted before isolation regions are formed, subsequent amorphizing can be performed to re-activate the dopant atoms that may have become de-activated during the (high temperature) isolation processing.

Figure 15:
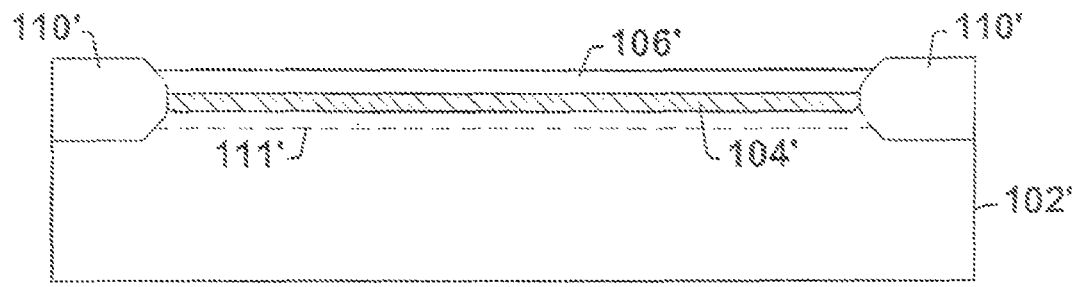
Figure 16:
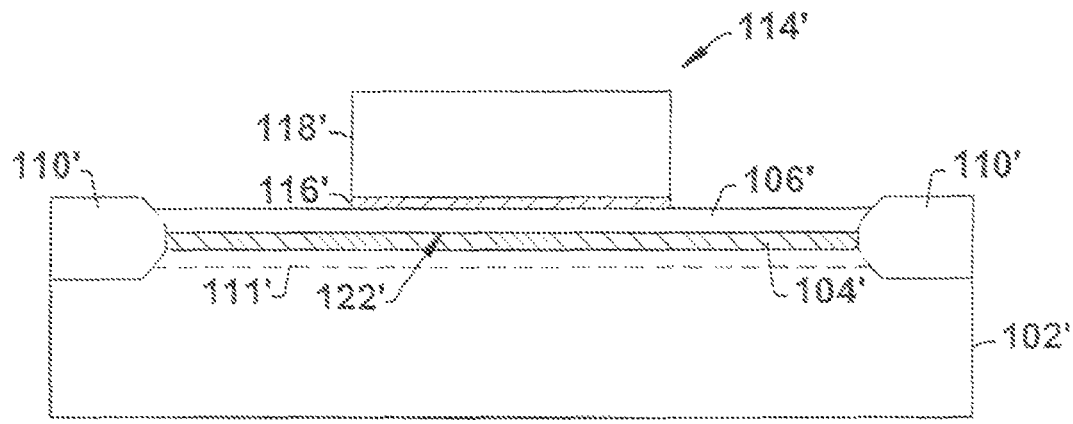
Figure 17:
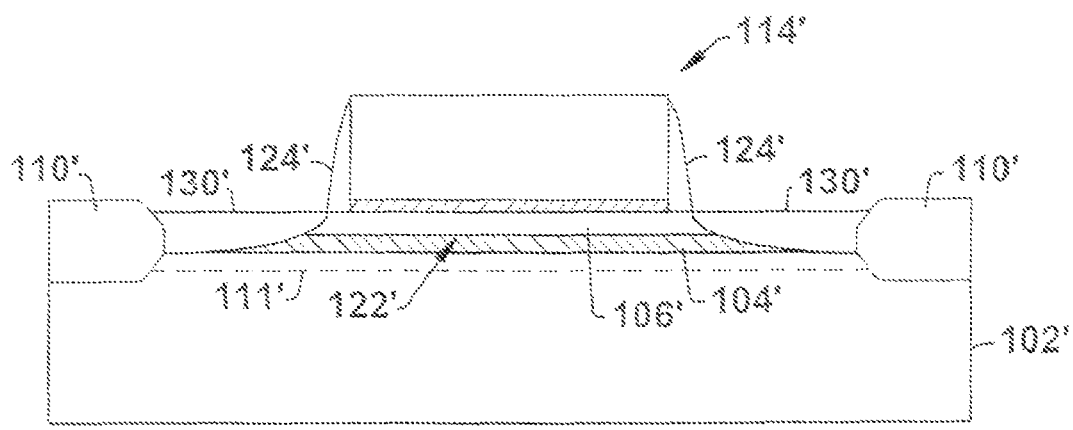

A layer of silicon capping material 106' is then formed over the layer of silicon carbon material at 14' (FIG. 15). A gate structure or gate stack 114' is subsequently formed over the layer of capping material 106' at 18' (FIG. 16). The gate structure 114' comprises a gate dielectric 116' under a gate electrode 118' and defines a channel region 122' thereunder within the substrate 102'. Offset spacers 124' are formed adjacent to the gate structure 114' at 20' (FIG. 17). Source/drain extension regions 130' are then formed at 22' within the substrate 102' on opposing sides of the channel region 122' with the offset spacers 124' serving as guides (FIG. 17). According to one or more aspects of the present invention, the extension regions 130' are formed with a phosphorus dopant. A thermal (anneal) may be performed to activate the dopants within the extension regions 130' which may cause the extension regions 130' to diffuse laterally under the offset spacers 124' toward the channel region 122' (FIG. 18).

Figure 18:
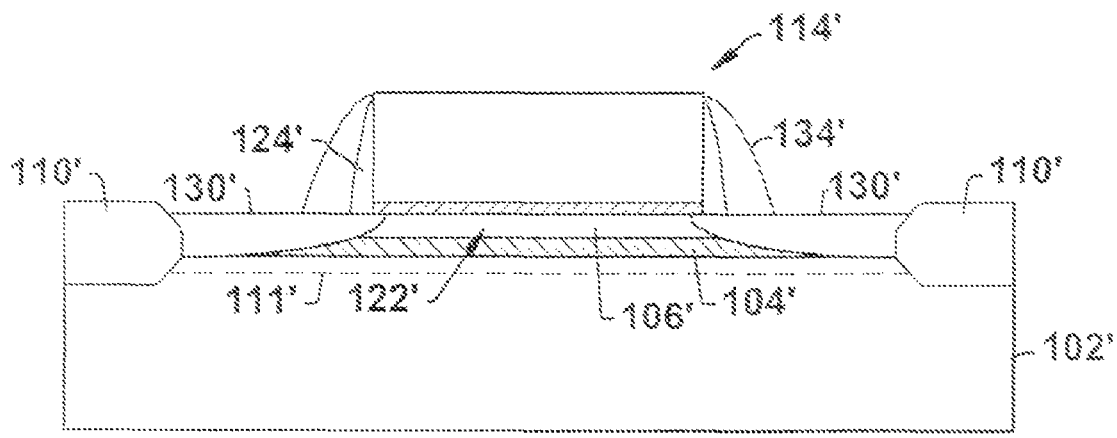
Figure 19:
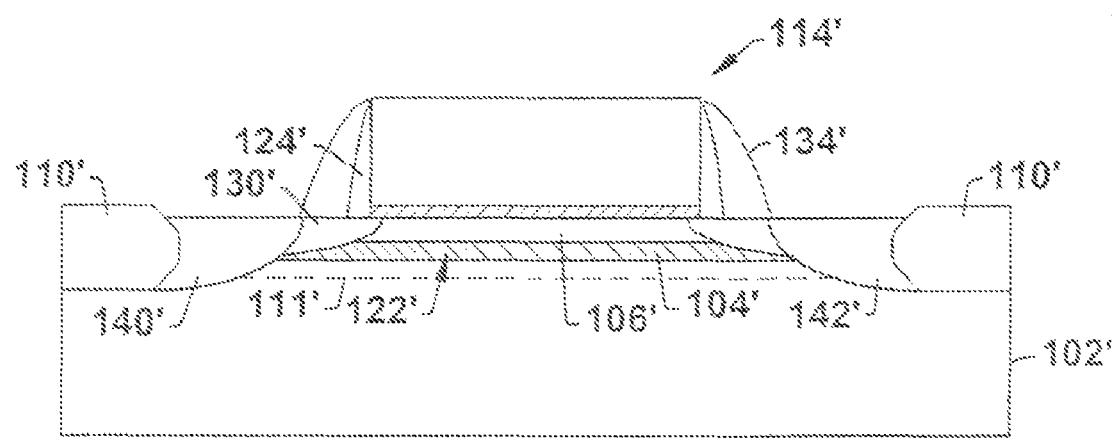
Figure 20:
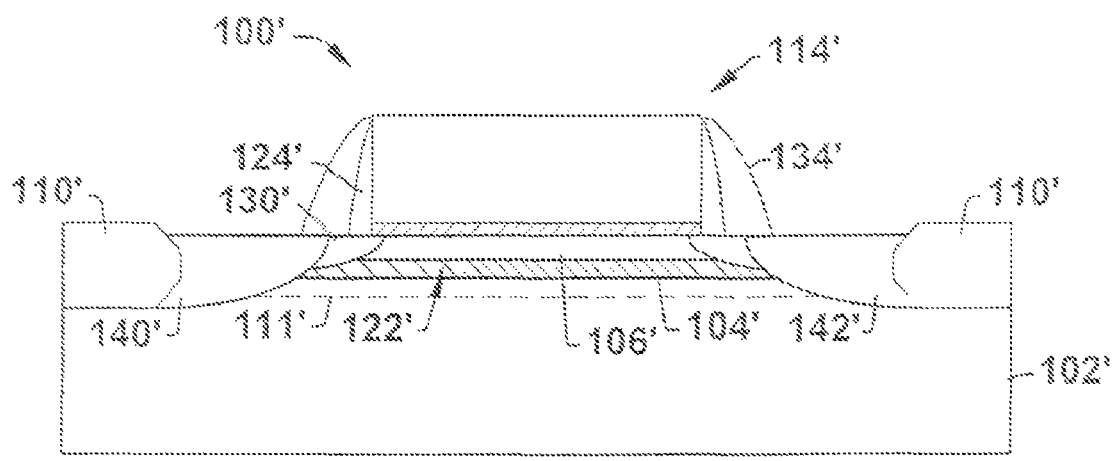

Sidewall spacers 134' are then formed on the offset spacers 124' at 24' (FIG. 18). Source and drain regions 140', 142' are then formed within the substrate 102' on opposing sides of the channel region 122' with the sidewall spacers 134' serving as guides (FIG. 19). According to one or more aspects of the present invention, the source and drain regions 140', 142' are formed with a phosphorus dopant. A thermal (anneal) is subsequently performed at 28' to activate source/drain dopants which may cause the source and drain regions 140', 142' to diffuse laterally under the sidewall spacers 134' toward the channel region 122' (FIG. 20). The methodology 10' then advances to 30' wherein further back end processing can be performed, such as siliciding, for example. The carbon within the silicon mitigates phosphorus diffusion and thereby facilitates sharper junctions between the source and drain regions 140', 142' and the channel region 122'.

Figure 21:
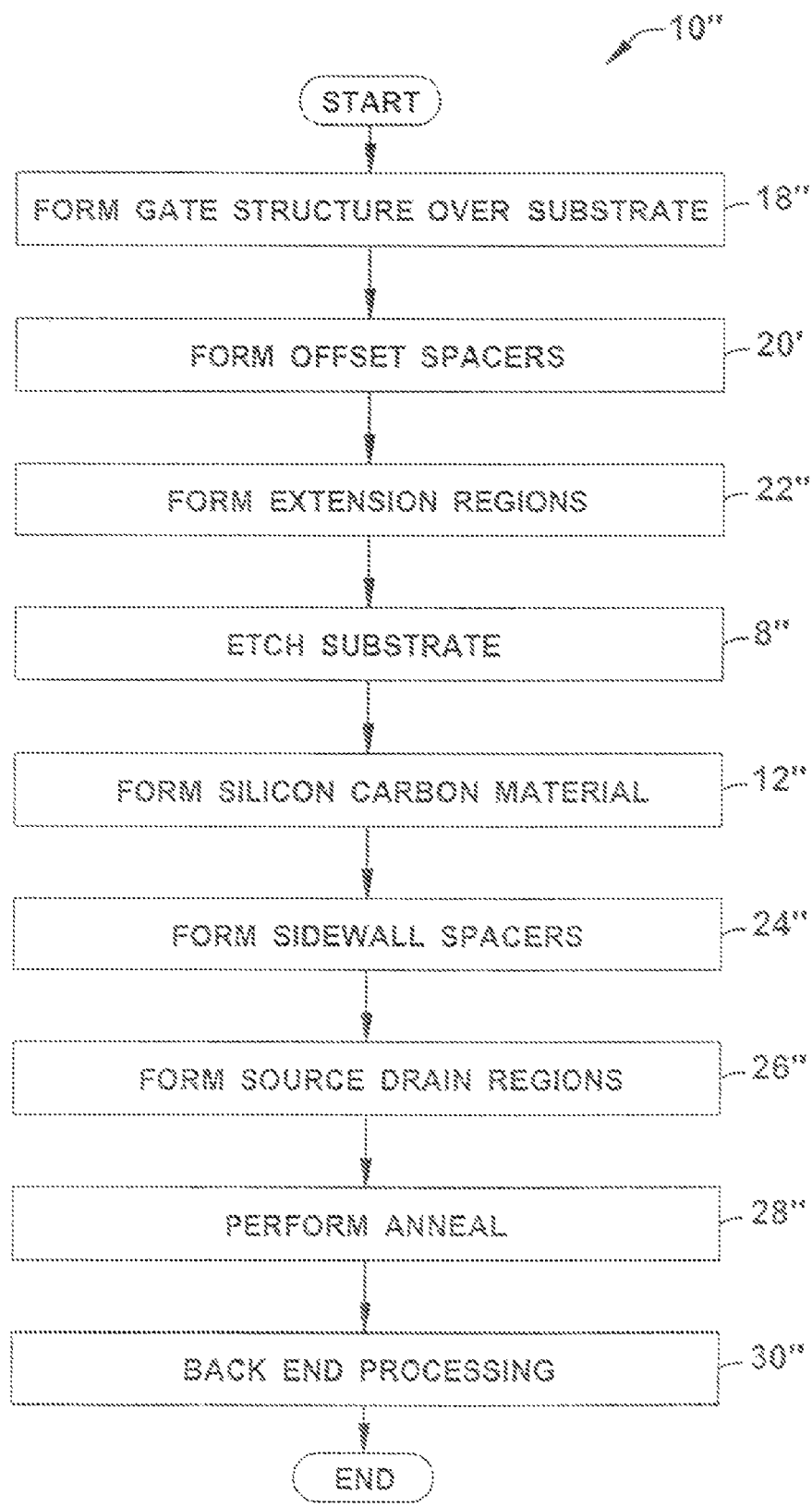
FIG. 21 is a flow chart illustrating yet another exemplary methodology of forming a transistor in accordance with one or more aspects of the present invention.

Turning to FIGS. 21-27, another exemplary methodology 10" is illustrated for forming a MOS transistor 100" (FIG. 27) in accordance with one or more aspects of the present invention, wherein FIG. 21 illustrates the exemplary methodology 10" and FIGS. 22-27 illustrate the exemplary transistor device at various stages of fabrication. Many of the acts of methodology 10" are similar to those of methodology 10 and thus are addressed with the same reference characters, but having a double prime "''" notation. Similarly, many of the layers, elements, etc. within the corresponding cross sectional FIGS. 22-27 are similar to those referenced within FIGS. 2-10 with regard to methodology 10 and thus are also labeled with the same reference characters, but also having a double prime "''" designation. For purposes of brevity the same layers, features, elements, acts, etc. of methodology 10 that are reproduced in methodology 10" and the accompanying figures, are not discussed in great detail.

Figure 22:
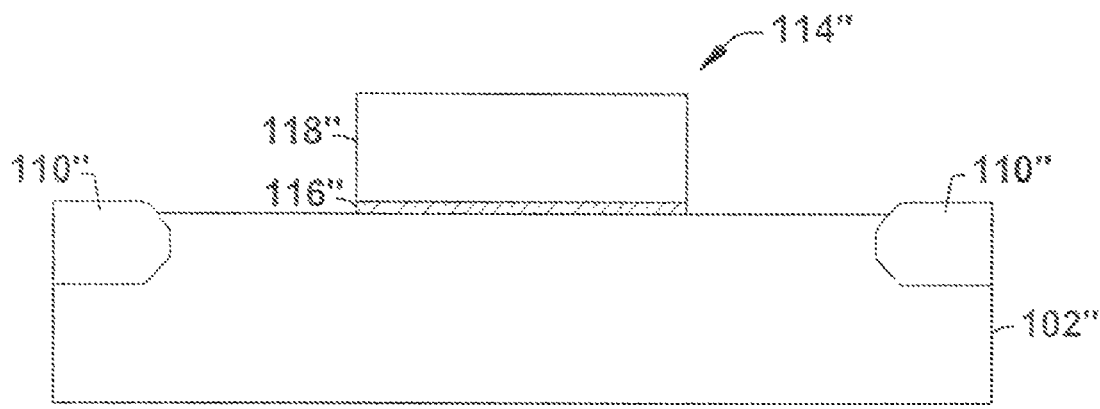
FIGS. 22-27 are a plurality of fragmentary cross sectional diagrams illustrating a transistor device being formed in accordance with the methodology set forth in FIG. 21.
Figure 23:
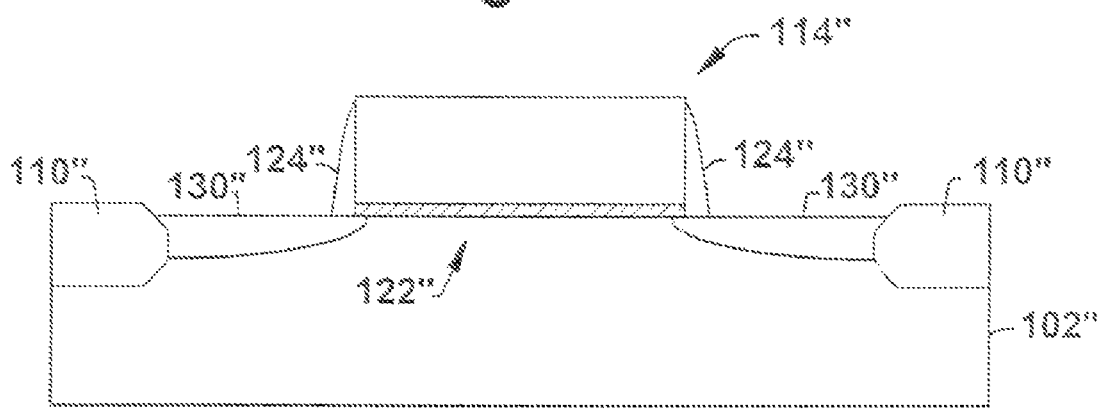

At 18" a gate structure 114" is formed over a substrate 102" at the beginning of the methodology 10" (FIG. 22). The gate structure 114" is formed within an active area of the substrate 102" which is electrically isolated from other active areas by isolation regions 110" formed in and on the substrate 102". Offset spacers 124" are formed adjacent to the gate structure 114" at 20" (FIG. 23). Source/drain extension regions 130" are then formed in the substrate 102" on opposing sides of a channel region 122" underlying the gate structure 114' at 22" (FIG. 23). The extension regions 130" are formed with a phosphorus dopant and are generally aligned with the offset spacers 124", but may creep under the spacers 124" as a result of thermal processing (e.g., a high temperature anneal) (FIG. 23).

Figure 24:
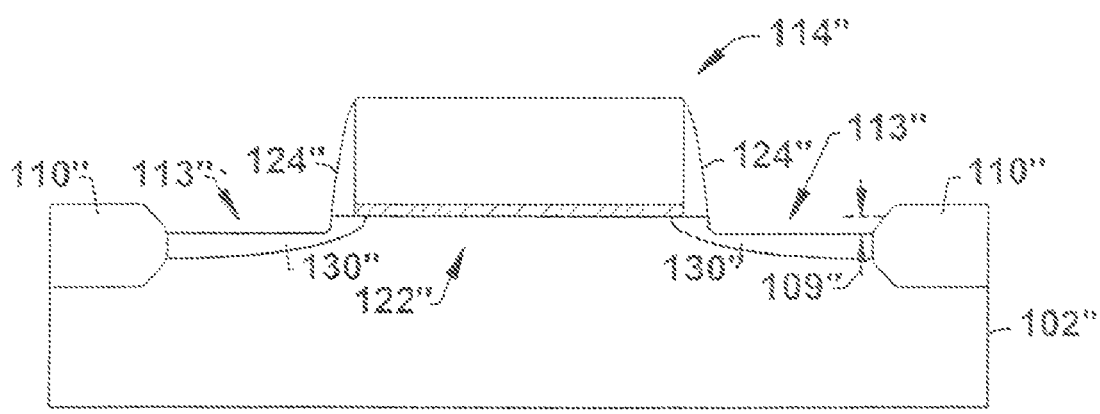
Figure 25:
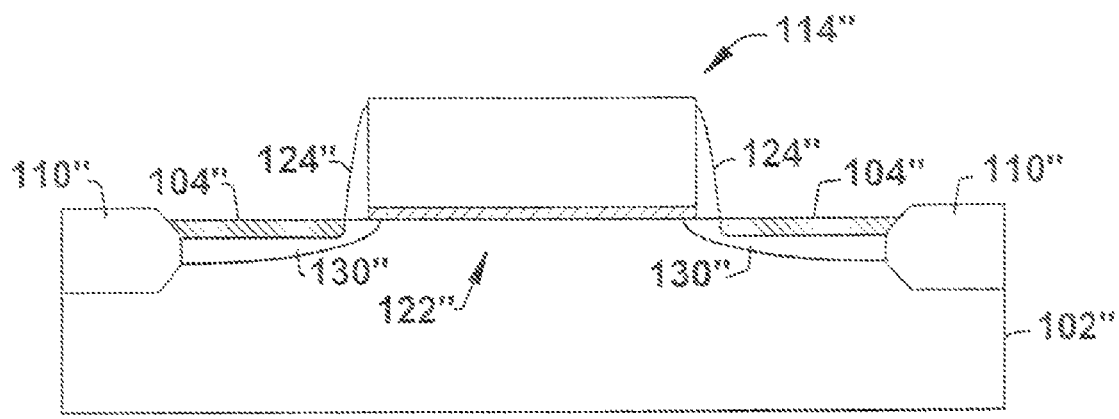
Figure 26:
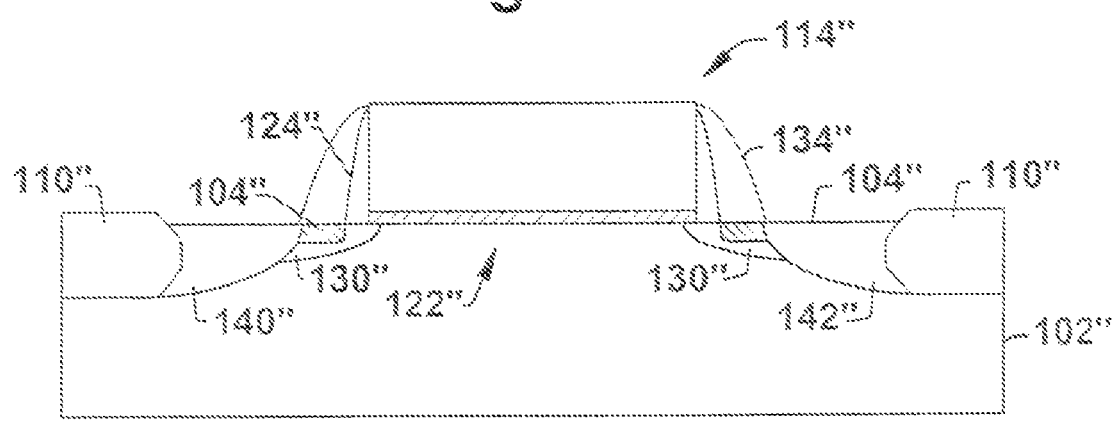
Figure 27:
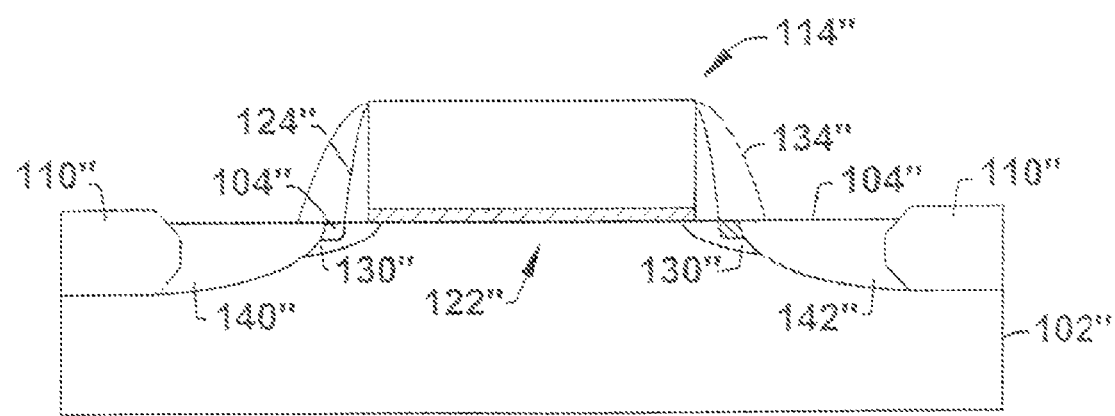

The substrate 102" is then etched at 8" to form recesses 113" therein between the offset spacers 124" and the isolation regions 110" (FIG. 24). Such recesses may be formed to a depth 109" of between about 200 angstroms to about 600 angstroms, for example. The recesses 113" are then filled with silicon carbon material 104' at 12' (e.g., via an epitaxial process) (FIG. 25). Sidewall spacers 134" are formed adjacent to the offset spacers 124" at 24" (FIG. 26). Source and drain regions 140", 142" are formed in the substrate 102" at 26" on opposing sides of the channel region 122" at 26" with a phosphorus dopant (FIG. 26). An anneal is then performed at 28" to activate source/drain dopants which may cause the source and drain regions 140", 142" to diffuse laterally under the sidewall spacers 134" toward the channel region 122" (FIG. 27). The methodology 10" then proceeds to 30" wherein further back end processing can be performed.

Figure 28:
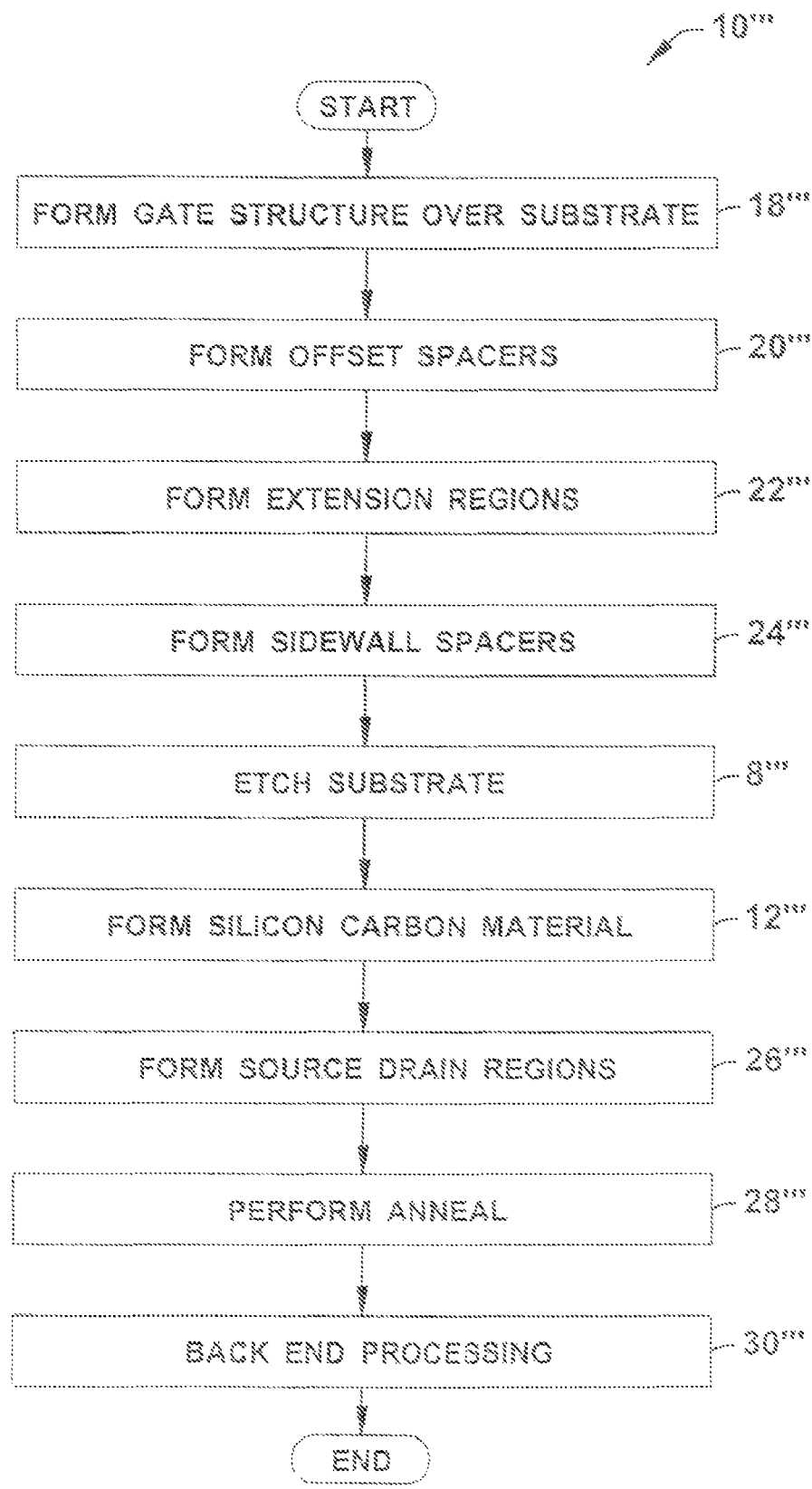
FIG. 28 is a flow chart illustrating still another exemplary methodology of forming a transistor according to one or more aspects of the present invention.

Turning to FIGS. 28-34, yet another exemplary methodology 10''' is illustrated for forming a MOS transistor 100'' (FIG. 34) in accordance with one or more aspects of the present invention, wherein FIG. 28 illustrates the exemplary methodology 10''' and FIGS. 29-34 illustrate the exemplary transistor device at various stages of fabrication. Many of the acts of methodology 10''' are similar to those of methodology 10 and thus are addressed with the same reference characters, but also having a triple prime "'''" designation. For purposes of brevity the same layers, features, elements, acts, etc. of methodology 10 that are reproduced in methodology 10''' and the accompanying figures, are discussed in substantially less detail.

Figure 29:
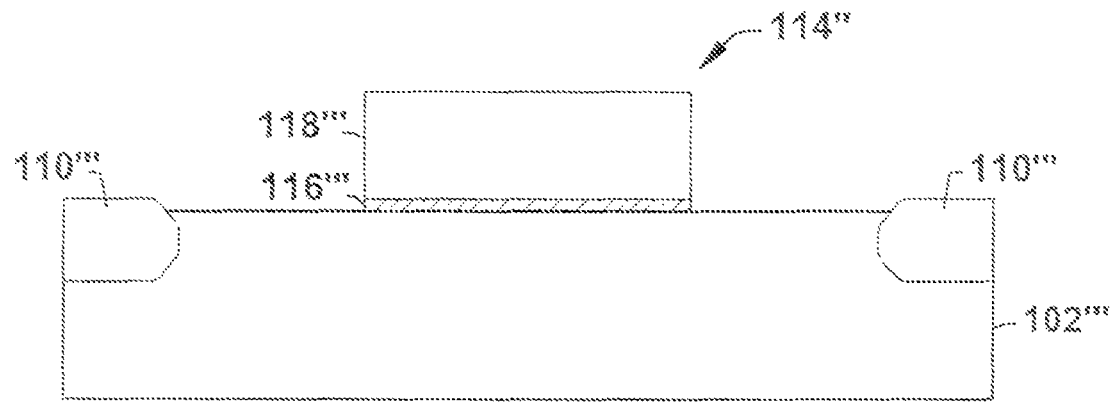
FIGS. 29-34 are a plurality of fragmentary cross sectional diagrams illustrating a transistor device being formed in accordance with the methodology set forth in FIG. 28.
Figure 30:
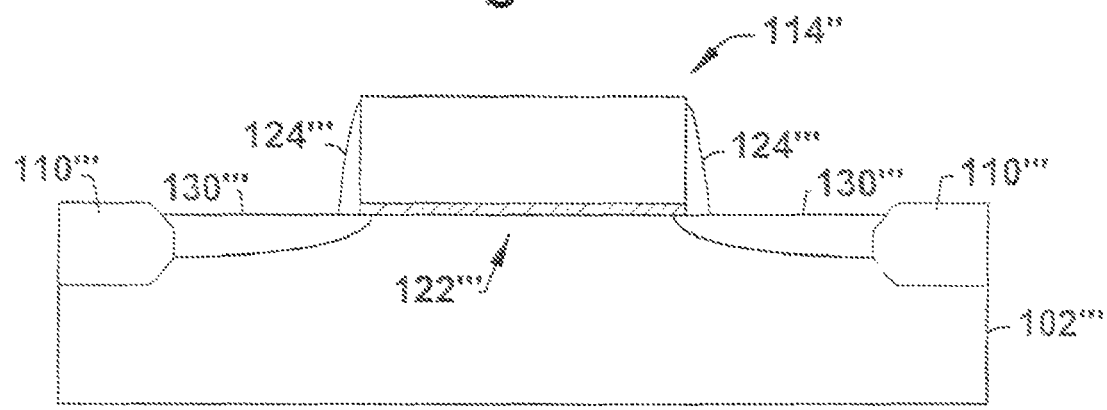
Figure 31:
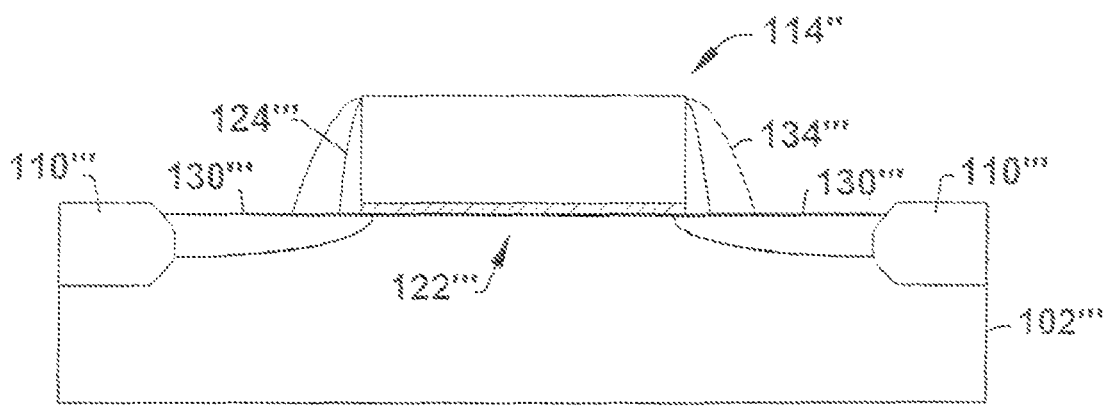

At the outset, a gate structure 114''' is formed over a substrate 102''' 18''' (FIG. 29). The gate structure 114''' is formed between isolation regions 110''' formed in and on the substrate 102''' that electrically isolate active regions from one another. At 20''' offset spacers 124''' are formed adjacent to the gate structure 114''' (FIG. 30). At 22''' source/drain extension regions 130''' are formed in the substrate 102''' on opposing sides of a channel region 122''' underlying the gate structure 114''' (FIG. 30). The extension regions 130''' are formed with a phosphorus dopant and are generally aligned with the offset spacers 124''', but may migrate under the spacers 124''' as a result of a thermal anneal (FIG. 30). Sidewall spacers 134''' are then formed adjacent to the offset spacers 124''' at 24''' (FIG. 31).

Figure 32:
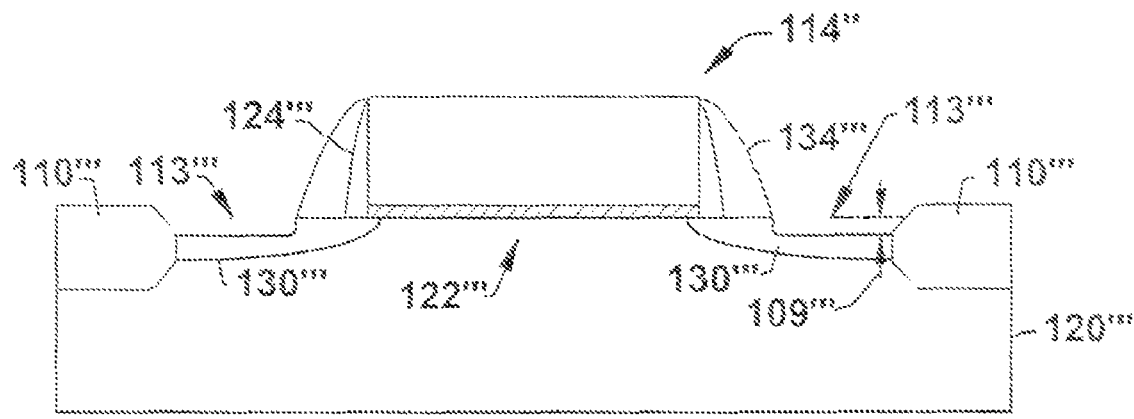
Figure 33:
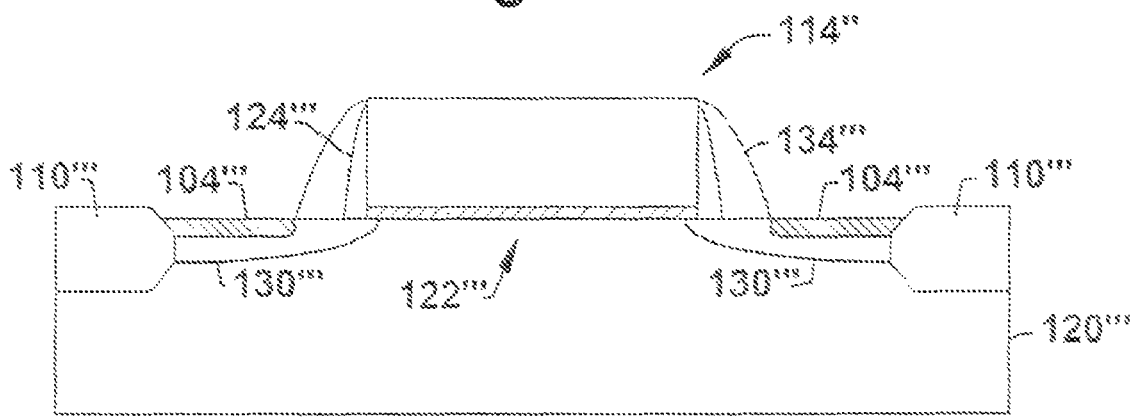
Figure 34:
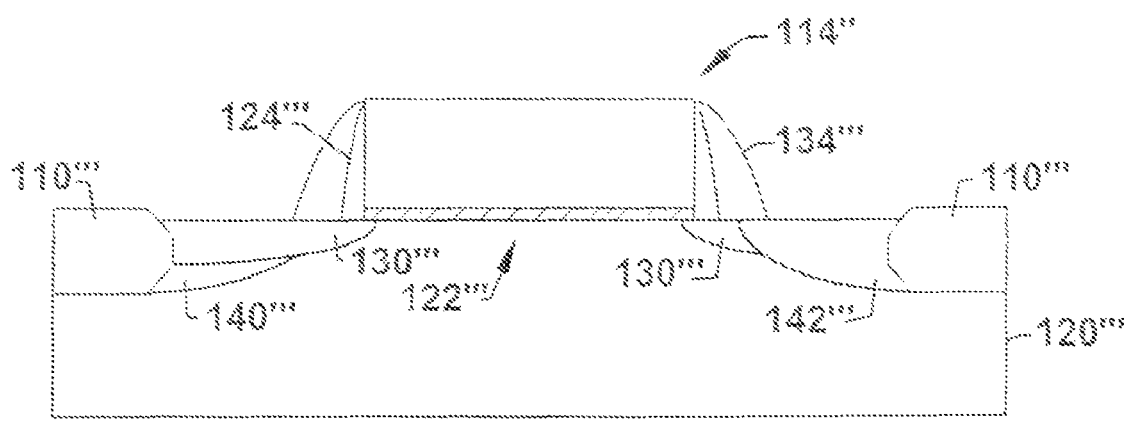

Recesses 113''' are then formed within the substrate 102''' (e.g., via etching) at 8''' (FIG. 32). In this example, the recesses 113''' are formed between the sidewall spacers 124''' and the isolation regions 110''' (FIG. 32). Such recesses may be formed to a depth 109''' of between about 200 angstroms to about 600 angstroms, for example. The recesses 113''' are then filled with silicon carbon material 104''' at 12''' (e.g., via an epitaxial deposition process) (FIG. 33). Source and drain regions 140''', 142''' are subsequently formed with a phosphorus dopant in the substrate 102''' a''' on opposing sides of the channel region 122''' at 26''' (FIG. 34). An anneal is then performed at 28''' to activate source/drain dopants which may cause the source and drain regions 140''', 142''' to diffuse laterally under the sidewall spacers 134''' toward the channel region 122''' (FIG. 34). The methodology 10''' then proceeds to 30''' wherein further back end processing can be performed.

It will be appreciated that an amorphizing implant can be performed to activate carbon atoms formed into the recesses 113'''. An energy utilized in such an implant can be tuned so that the complete depth of the silicon carbide within the source/drain regions 140''', 142''' is fully amorphized. Atoms such as Germanium and/or Indium can be implanted, for example, at relatively high dosages, such as at about 1E15 atoms/cm$^3$ or 1E14 atoms/cm$^3$, respectively, for example, to achieve a depth of about 1000 angstroms. It will be appreciated that the gate structure would be masked off for the amorphizing implant. Further, while not intending to be limited to any one theory, it is believed that the silicon carbon material 104''' within the recesses 113''' form an alloy that has a lattice with the same structure as the silicon substrate lattice. However, the silicon carbon alloy has a smaller spacing. Consequently, it is believed that the silicon carbon material 104''' within the recesses 113''' will tend to contract, thereby creating a tensile stress within the channel 122''' of the semiconductor substrate 102'''.

It will be appreciated that while reference is made throughout this document to exemplary structures in discussing aspects of methodologies described herein (e.g., those structures presented in FIGS. 2-10 while discussing the methodology set forth in FIG. 1, those structures presented in FIGS. 12-20 while discussing the methodology set forth in FIG. 11, those structures presented in FIGS. 22-28 while discussing the methodology set forth in FIG. 21 and those structures presented in FIGS. 29-34 while discussing the methodology set forth in FIG. 28), that those methodologies are not to be limited by the corresponding structures presented. Rather, the methodologies (and structures) are to be considered independent of one another and able to stand alone and be practiced without regard to any of the particular aspects depicted in the accompanying figures.

Further, from time to time throughout this specification and the claims that follow, one or more layers or structures may be described as being or containing a substance such as "carbon", etc. These descriptions are to be understood in context and as they are used in the semiconductor manufacturing industry. For example, in the semiconductor industry, when a layer is described as containing carbon, it is understood that the layer comprises pure carbon as a principle component, but that the pure carbon may be, and typically is, alloyed, doped, or otherwise made impure. The carbon material is not, however, treated to such an extent that its basic properties are substantially different from that of high purity stoichiometric carbon.

Also, the term "exemplary" as used herein is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that the actual dimensions of the elements may differ substantially from that illustrated herein. Additionally, unless stated otherwise and/or specified to the contrary, any one or more of the elements and/or layers set forth herein can be formed in any number of suitable ways, such as with spin-on techniques, sputtering techniques (e.g., magnetron and/or ion beam sputtering), thermal growth techniques and/or deposition techniques such as chemical vapor deposition (CVD), physical vapor deposition (PVD) and/or plasma enhanced chemical vapor deposition (PECVD), or atomic layer deposition (ALD), for example.

The layers described herein are also generally conformal (e.g., to underlying features) when formed, unless stated to the contrary. Additionally, the layers described herein can be patterned in any suitable manner (unless indicated to the contrary), such as with etching and/or lithographic techniques. Lithography refers to processes for pattern transfer between various media. A radiation sensitive resist coating is formed over one or more layers to which the pattern is to be transferred. The resist is itself first patterned by exposing it to radiation, where the radiation (selectively) passes through an intervening mask containing the pattern. As a result, the exposed or unexposed areas of the resist coating become more or less soluble, depending on the type of resist used. A developer is then used to remove the more soluble areas leaving the patterned resist. The pattered resist can then serve as a mask for the underlying layers which can be selectively etched to transfer the pattern thereto.

Although one or more aspects of the invention have been illustrated and described with respect to one or more implementations, equivalent alterations and/or modifications may occur to others skilled in the art based upon a reading and understanding of this specification and the annexed drawings. The invention is intended to include all such modifications and alterations. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A transistor, comprising:
    a semiconductor substrate, at least some of which is treated to include carbon;
    a gate structure formed over the semiconductor substrate and defining a channel therebelow in the semiconductor substrate;
    source and drain regions formed within the semiconductor substrate on opposing sides of the channel, the source and drain regions formed with a phosphorus dopant, wherein the source and drain regions are located in regions of the semiconductor substrate that include carbon and the channel region is located in a region of the semiconductor substrate that is not treated to include carbon, the surface of the source and drain regions being planar with the surface of the semiconductor substrate, wherein the regions of the semiconductor substrate that include carbon do not extend under the gate structure;
    source and drain extension regions formed in the semiconductor substrate on opposing sides of the channel, the source and drain extension regions formed with a phosphorous dopant and extending into the channel further than the source and drain regions; and
    offset spacers formed adjacent to the gate structure, wherein the source and drain extension regions are substantially aligned with the offset spacers, and wherein regions of the substrate substantially aligned with the offset spacers include carbon.

2. A transistor, comprising:
    a semiconductor substrate, a first region of the semiconductor substrate including carbon;
    a gate structure formed over the semiconductor substrate and defining a channel therebelow in the semiconductor substrate;
    offset spacers formed adjacent to the gate structure, wherein the first region of the semiconductor substrate including carbon is substantially aligned with the offset spacers;

source and drain regions formed within the semiconductor substrate on opposing sides of the channel, the source and drain regions formed with a phosphorus dopant, wherein the source and drain regions are located in the first region of the semiconductor substrate that includes carbon and the channel region is located in a second region of the semiconductor substrate that is not treated to include carbon, the surface of the source and drain regions being planar with the surface of the semiconductor substrate;

source and drain extension regions formed in the semiconductor substrate on opposing sides of the channel, the source and drain extension regions formed with a phosphorous dopant and extending into the channel further than the source and drain regions, wherein the source and drain extension regions are substantially aligned with the offset spacers.

* * * * *